United States Patent
Ulrich et al.

(10) Patent No.: US 7,190,526 B1
(45) Date of Patent: Mar. 13, 2007

(54) STEP-OVER LITHOGRAPHY TO PRODUCE PARABOLIC PHOTORESIST PROFILES FOR MICROLENS FORMATION

(75) Inventors: Bruce D. Ulrich, Beaverton, OR (US); Yoshi Ono, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 11/416,983

(22) Filed: May 2, 2006

(51) Int. Cl.
*G02B 27/10* (2006.01)
*B29D 11/00* (2006.01)
*G03C 5/00* (2006.01)

(52) U.S. Cl. .................. 359/619; 216/26; 430/321
(58) Field of Classification Search ............ 359/619; 216/26; 430/321
See application file for complete search history.

(56) References Cited

U.S. PATENT DOCUMENTS

| | | | |
|---|---|---|---|
| 5,324,623 A | 6/1994 | Tsumori | |
| 6,163,407 A | 12/2000 | Okazaki et al. | |
| 6,417,022 B1 | 7/2002 | Hsiao et al. | |
| 6,495,813 B1 | 12/2002 | Fan et al. | |
| 6,781,762 B2 * | 8/2004 | Ozawa | 359/619 |
| 2002/0102498 A1 * | 8/2002 | Hsin | 430/321 |

* cited by examiner

*Primary Examiner*—Ricky Mack
*Assistant Examiner*—Jack Dinh
(74) *Attorney, Agent, or Firm*—Robert D. Varitz, PC

(57) ABSTRACT

A method of microlens fabrication for use in a photosensor includes preparing a photodetector element array which is sensitive to light in a specific color domain and depositing microlens material on the photodetector element array. The structure is coated with photoresist, and the photoresist is masked and exposed in a separate exposure for each color in the color domain. The photoresist is developed and the microlens material etched to form a microlens array.

12 Claims, 5 Drawing Sheets

STEP-OVER LITHOGRAPHY TO PRODUCE PARABOLIC PHOTORESIST PROFILES FOR MICROLENS FORMATION

FIELD OF THE INVENTION

This invention relates to image sensing devices, and specifically to improvements in the light collecting efficiency for image sensing in CCD and CMOS imagers.

BACKGROUND OF THE INVENTION

The light forming the image that is focused onto an imaging device has an inherent efficiency for detection. The photon flux through an aperture falls onto a sensor surface and is converted into an electrical signal that is stored as one component of a pixel of a digital image. Each pixel of the image is typically composed of either of three individual photodetectors corresponding to a color domain, having three of the fundamental colors, e.g., red, green, blue (RGB) or the complimentary color domain having cyan, magenta, yellow (CMY). The intensity of the electrical signal is roughly proportional to the quantity of photons sensed at each photodetector. A lens, or microlens, is typically used to focus the incoming light into the active area of each photodetector. Larger numbers of photons provide a better signal-to-noise ratio from the device. The microlens may be formed from any set of process steps which generate a convex lens shape in a material having a relatively high refractive index, e.g., greater than 1.5, above the photodetector.

Typical formation processes incorporate resist reflow, or dielectric material reflow, techniques. These processes require precise control of the reflow temperature, duration, thickness of the material, etc. Many factors can cause variation in the ultimate shape of the lens. Lens shape repeatability and aberrations caused by distortions are common problems using such techniques.

Another problem with lens stack design is that an optimum design for one color may not be quite right for another color. The reason for this is dispersion in a typical lens material is a function of light wavelength, as shown in FIG. 1, which depicts the index of refraction, n, for a lens material, wherein n varies with the wavelength.

Titanium dioxide ($TiO_2$) is a material frequently incorporated into microlenses. The refractive index for a $TiO_2$ lens varies with wavelength, and the difference can be as much as 0.1 between the blue and the red regions. In contrast, silicon dioxide, which is generally used to encase a $TiO_2$ lens, has refractive index of 1.47 with an index of refraction range of less than 0.01 between the blue and red regions. The lens stack focal point depth is different for blue and red, perhaps by as much as 0.25 microns. $TiO_2$ material is known to have a high refractive index, while being transparent in the visible range for maximum light transmission. Other high refractive index transparent materials exist wherein similar dispersion of n is seen.

U.S. Pat. No. 5,324,623, to Tsumori, granted Jun. 28, 1994, for Microlens forming method, describes a method of forming a microlens made of a thermoplastic resin on a solid-state imaging device, wherein the surface of an imaging device is patterned, and filled with the thermoplastic resin, which is then thermally deformed.

U.S. Pat. No. 6,163,407, to Okazaki et al., granted Dec. 19, 2000, for Microlens array and method of forming same and solid-state image pickup device and method of manufacturing same, describes a pattern for a microlens array and a material layer of the microlens array, which are simultaneously etched under a condition by which planar patterns transferred from the resist to the material layer are larger than planar patterns of the resist. The spacing between microlenses can be made narrower than the spacing between the planar patterns of the resist.

U.S. Pat. No. 6,417,022 B1 to Hsiao et al., granted Jul. 9, 2002, for Method for making long focal length micro-lens for color filters, describes a method including providing a layer of micro-lens material, which is spin coated on a color filter, patterned by a photolithographic method into a number of discrete regions for each micro-lens with a pre-set spacing therein between. The discrete regions allow a smaller volume of micro-lens material to be used for forming the micro-lens in a subsequent reflow process.

U.S. Pat. No. 6,495,813 B1 to Fan et al., granted Dec. 17, 2002, for Multi-microlens design for semiconductor imaging devices to increase light collection efficiency in the color filter process, describes a microelectronic fabrication methods for forming planar array multi-microlenses comprised of elements consisting of lens-pairs, integrated with color-filters, and compatible with CMOS high-volume manufacturing are taught.

SUMMARY OF THE INVENTION

A method of microlens fabrication for use in a photosensor includes preparing a photodetector element array which is sensitive to light in a specific color domain; depositing microlens material on the photodetector element array; coating the microlens material with photoresist; masking and exposing the photoresist in a separate exposure for each color in the color domain, wherein said masking and exposing includes providing a separate mask and exposure for each color of the color domain, wherein each mask is constructed and arranged as a function of a refractive index of the microlens material for each wavelength of the color in the color domain; developing the photoresist; etching the microlens material to form a microlens array; and completing the photosensor. Alternately, the mask for each color in the color domain may be fabricated without regard for the refractive index of the microlens material.

It is an object of the invention to provide a method to generate improved shapes in photoresist having better reproducibility and accuracy using photolithographic techniques.

Another object of the invention is to provide a technique which allows customized shapes for the lens for each color.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENTS

A method is disclosed to generate improved shapes in photoresist having better reproducibility and accuracy using photolithographic techniques with parameters that can be programmed into a stepper. This also allows customized shapes for the lens for each color of a color domain, thereby optimizing the focal point for, e.g., blue, green, and red photons, independent of each other.

The objective of the invention is to produce convex lens shapes in a high refractive index material for the purpose of concentrating photons impinging on the surface of a film onto the active photodectector element. This method offers the advantage of better reproducibility and possibly simpler processing sequences. The dimensions of the lens can be made extremely small, offering scalability to approximately a one-micron diameter. Both convex and concave shapes can be generated in the photoresist, which is then transferred to underlying material through appropriately developed dry etch processes.

By systematically decomposing the final microlens array into either 2, 3, 4 or more parts, and then using each part separately for the exposure process, one can achieve better control over both the density of microlenses as well as the shape of each individual set of microlenses, however, there is a disadvantage in that extra exposures are required to compose the final exposed pattern.

The shape of the microlenses formed with each of the exposures may be tailored for each of the three fundamental colors of incoming light. For example, for the RGB method three different wavelengths, corresponding to the red, green and blue colors, are used. Thus, in this example, three exposures are desired to photo-compose the microlens array, with each exposure producing a desired lens shape for the red, green and blue lenses in the microlens array.

This invention addresses directly the problem of the light diffraction when the nearest neighboring lenses give rise to a loss of control of the patternability due to diffraction and other effects where proximity effects dominate. By increasing the distance of nearest neighboring lenses by decomposition of the final pattern these detrimental diffraction effects are drastically reduced.

Figure 1:
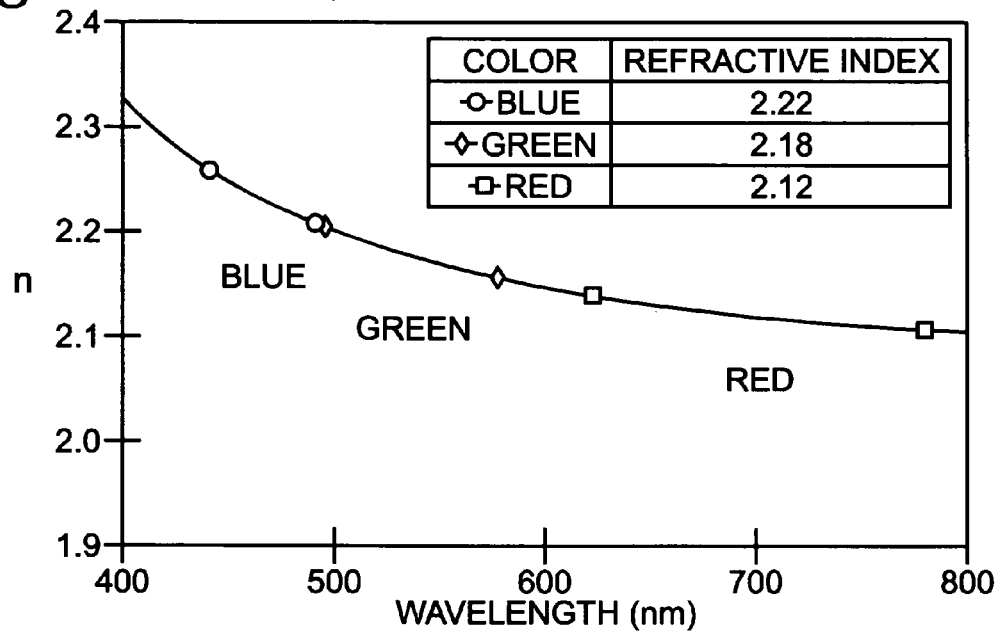
FIG. 1 depicts variation of the index of refraction within lens material as a function of the light wavelength.
Figure 2:
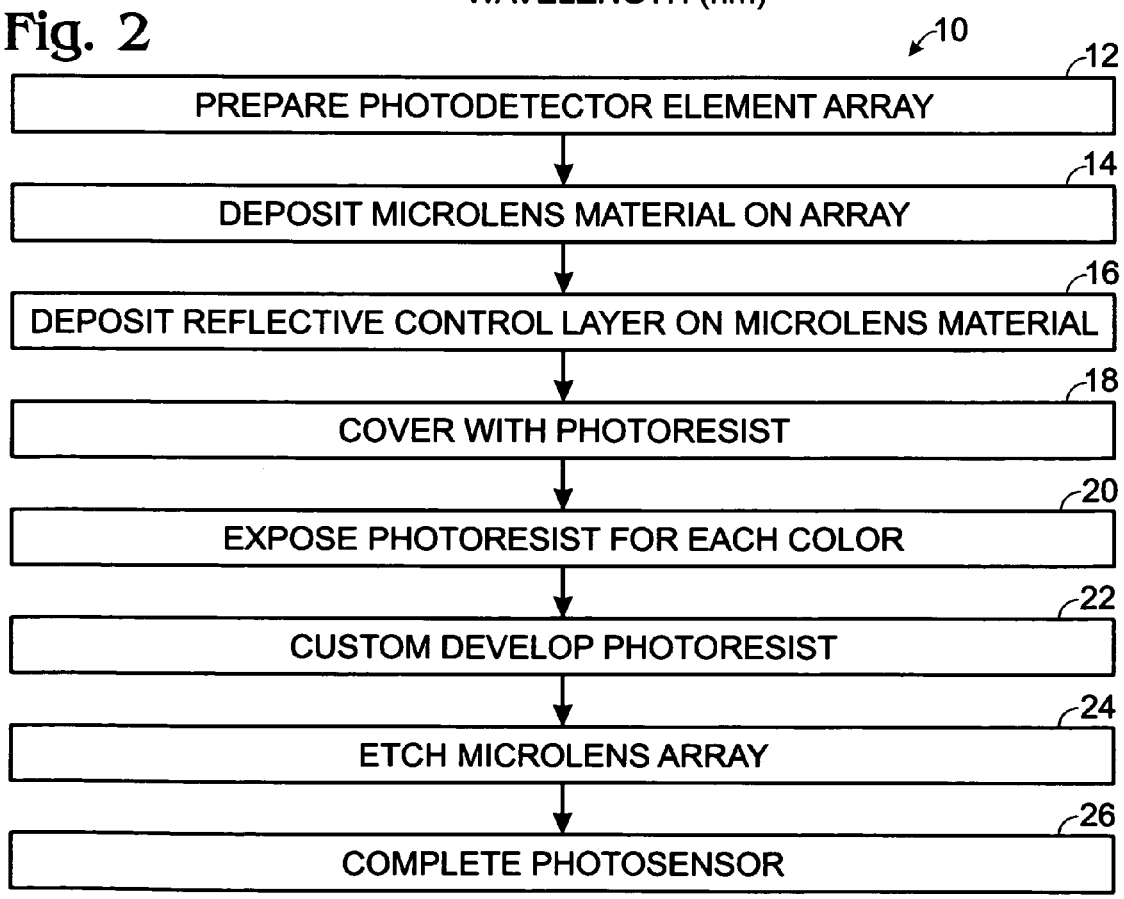
FIG. 2 is a block diagram of the method of the invention.

FIG. 2 is a process flow chart that which depicts the method of the invention, generally at 10. Initially, a photodetector element array is prepared 12, according to conventional, state-of-the-art techniques. This array will become part of a photosensor when fabrication is completed. Microlens material is deposited 14 on the array, again, by state-of-the-art techniques, and a layer of reflective control material is deposited thereover, 16. A layer of photoresist is deposited on the structure, 18. In the convention process, the photoresist would be patterned, developed and etched, forming microlenses for each color simultaneously. In the method of the invention, the photoresist is masked and exposed for each color, 20, of the selected color domain, requiring three separate masking and exposure steps. The photoresist is then custom developed, 22, using a low-temperature post exposure bake prior to developing, and the microlens array etched to form the individual microlenses over the photodetector element array, 24. The disclosed method of the invention easily is incorporated into a conventional fabrication process. Additional exposures steps are all done automatically, one after another, by the exposing tool. The photosensor is then completed, 26, by state-of-the-art techniques.

Figure 3:
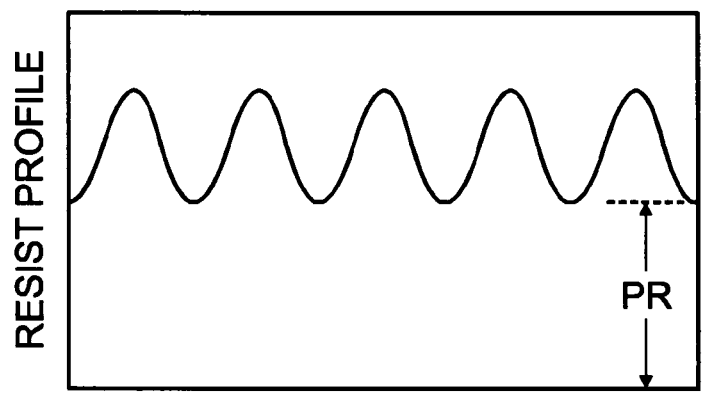
FIG. 3 is a graph of a resist profile of a prior art technique.

In the conventional single shot method, the photoresist is exposed not only by the pattern directly above it, but also from the neighboring patterns. Therefore the resulting profile between the peaks has been exposed and the valleys have a thickness of photoresist, PR, as shown in FIG. 3. This is not desired as the etching of the lens material cannot take place immediately after the develop process.

Figure 4:
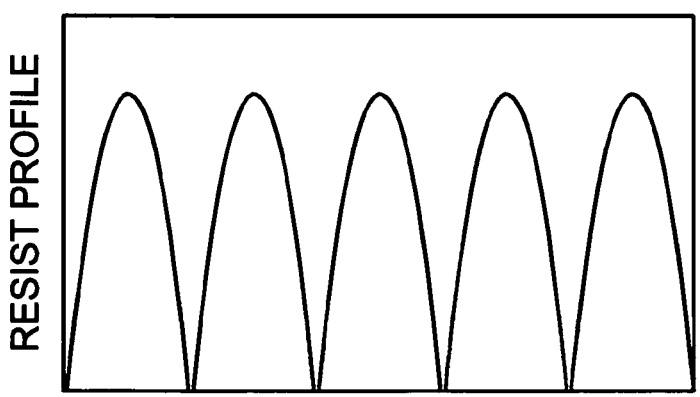
FIG. 4 is a graph of a resist profile of the method of the invention.

Referring now to FIG. 4, which depicts a resist profile for the method of the invention, with the multiple shot method of the invention, the valleys between the photoresist peaks easily are removed completely. This is because the light has not been given the chance to interact with the nearest neighboring patterns to the degree that the photoresist has been affected. This is simply due to the lateral displacement of the patterns being increased by approximately 1.7 times the pattern's diameter as compared to the approximately 1 times the pattern's diameter in the conventional case. With the conventional process, there is a resist thickness in the valleys whereas with the process of the method of the invention there is no resist between peaks.

Figure 5:
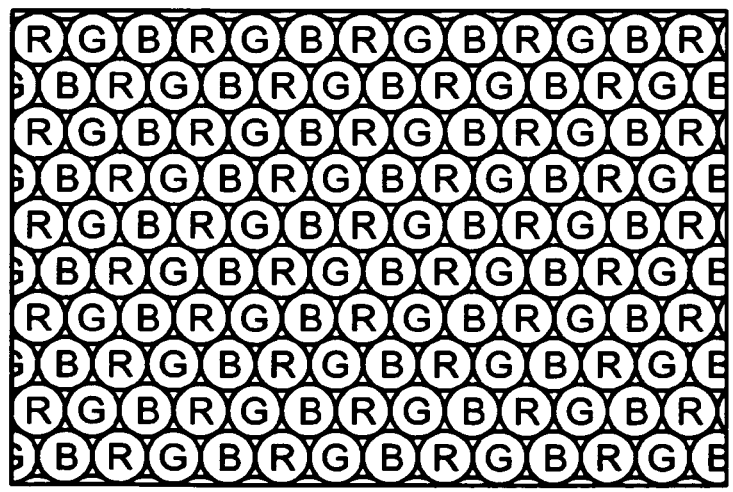
FIG. 5 depicts a microlens array fabricated according to the method of the invention.
Figure 6:
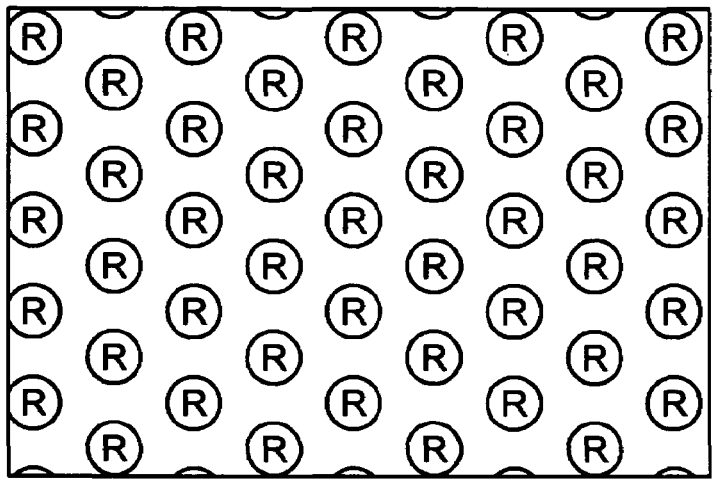
FIGS. 6–8 depicts masks used in the multiple exposure process of the method of the invention for red, green and blue sensors, respectively.
Figure 7:
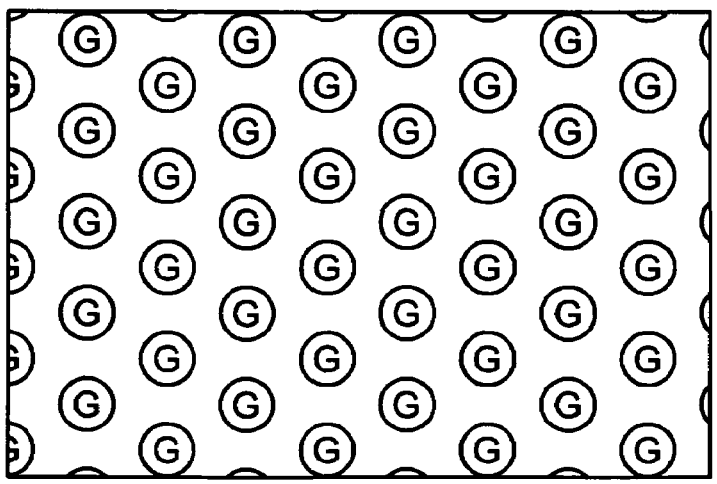
Figure 8:
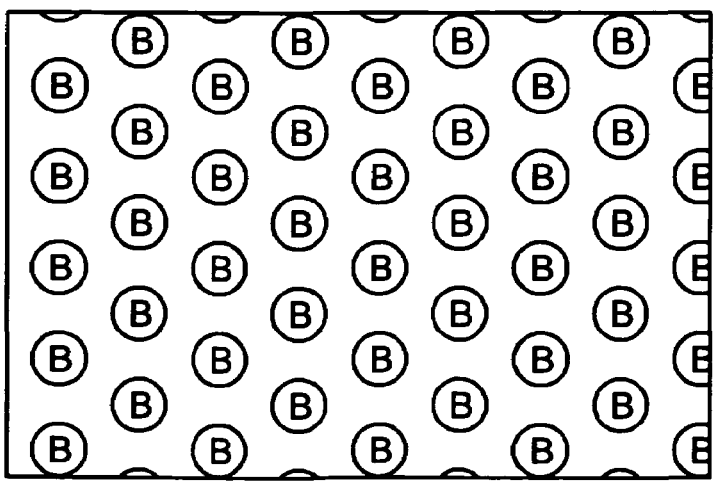

Referring now to FIGS. 5–8, a microlens array is depicted in FIG. 5, while FIGS. 6–8 depict the masks as may be used to fabricate the array of FIG. 5. (The alpha characters (R,G,B) are for explanation only and are not included in the actual pattern.) FIG. 5 depicts a top view of a microlens array made by either the conventional one shot method or by the disclosed multiple shot method of the invention, which, in this particular case, was a triple shot exposure according to the method of the invention. FIG. 5 may also depict a mask used to make the microlens array as in a conventional one shot exposure method.

FIGS. 6–8 depict the masks used in the multiple shot exposure method of the invention to produce the microlens array of FIG. 5. Each of these three figures may be the same mask, i.e., with a translation in the left to right direction as shown, or the figures may be separate masks, or any combination thereof. As can easily be seen, the density of patterns of each of FIGS. 6–8, are less than the density of FIG. 5, however, they have uniform density amongst themselves. By superimposing FIGS. 6–8, the composite pattern of FIG. 5 is produced.

Figure 9:
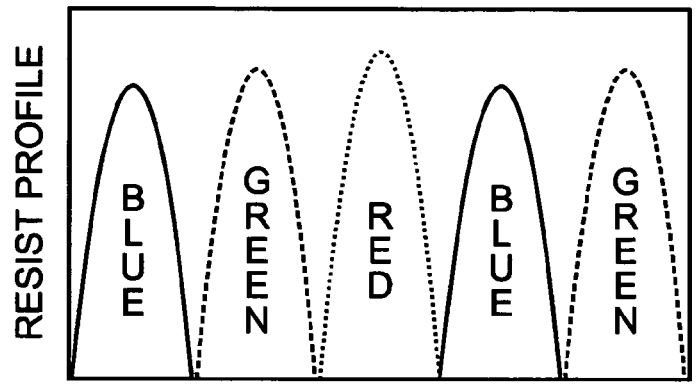
FIG. 9 depicts a resist profile resulting from the use of a customized exposure for each sensor color.

One can tailor the resist profile for each of the blue, green, and red colors. This is done by controlling the focus and dosage of light from each of the three exposures for the B, G, and R colors respectively. FIG. 9 depicts the resist profile of a cross-section of a microlens array used in the customized exposure embodiment of the method of the invention for each color.

Figure 10:
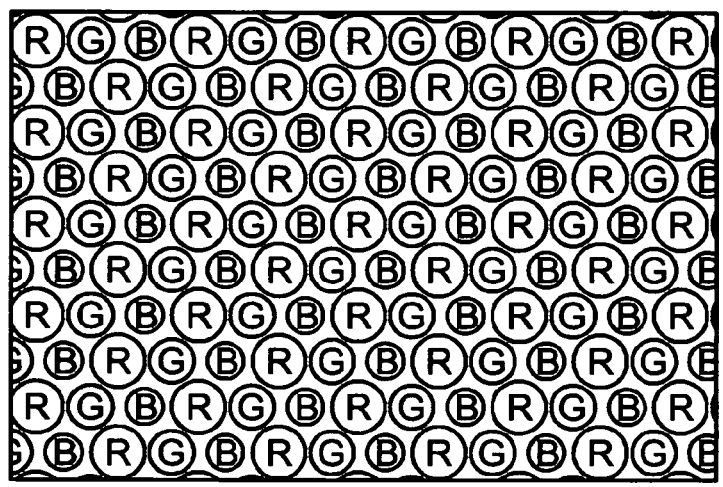
FIG. 10 depicts a microlens array fabricated according to an alternate embodiment of the method of the invention.
Figure 11:
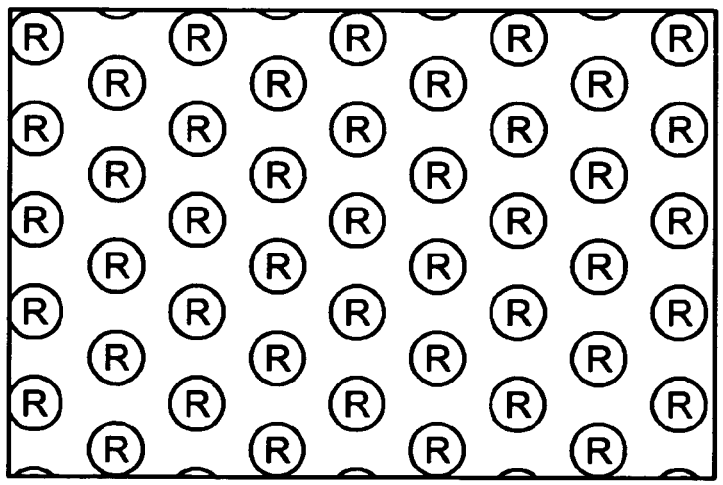
FIGS. 11–13 depicts masks used in the multiple exposure process of an alternate embodiment of the method of the invention for red, green and blue sensors, respectively.
Figure 12:
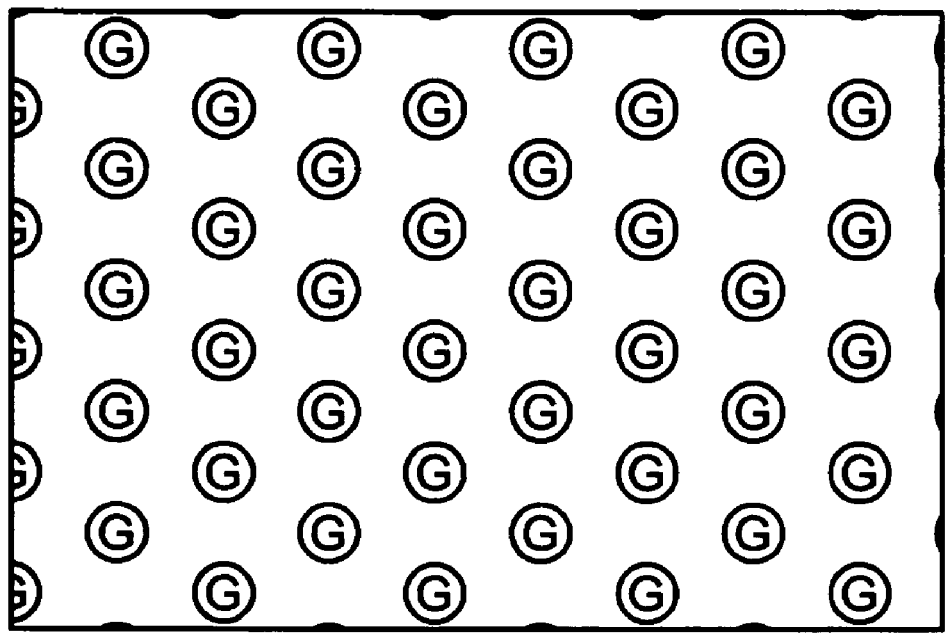
Figure 13:
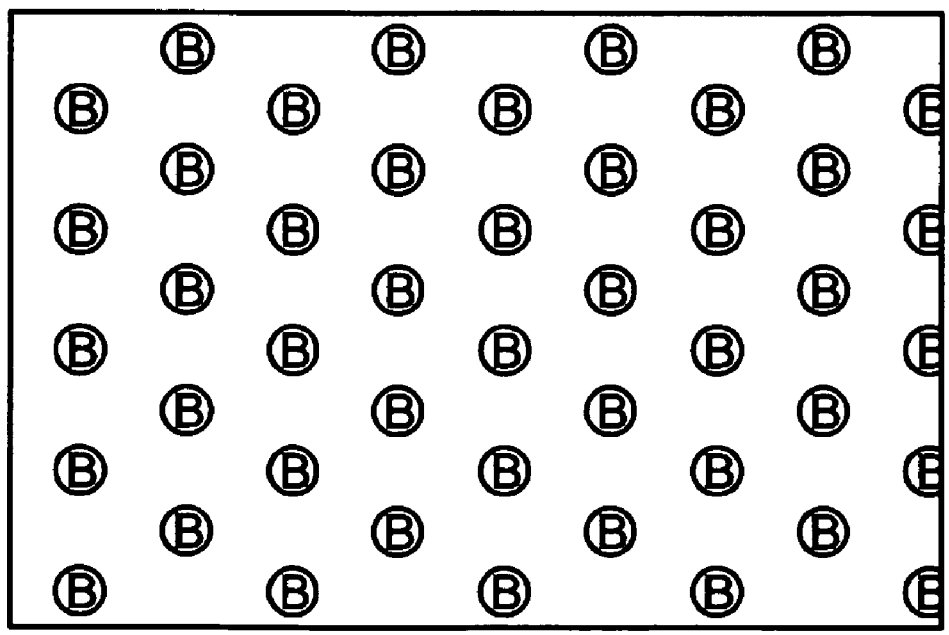

FIG. 10 is essentially the same as FIG. 5, except that a size variation for each of the R, G, and B colors has been added, as shown in FIGS. 11–13. FIG. 10 is a depiction of a microlens array and is also a depiction of the mask used in the conventional one shot exposure method. FIGS. 11–13 are depictions of masks used in the disclosed multiple exposure method, wherein the size of the R, G, and B lenses are different, and are sized as a function of the refractive index of the material used for the microlenses for each color spectra wavelength.

The preferred embodiment of this invention uses a binary reticle, e.g., Cr/CrO on quartz. An alternative embodiment may use a phase shifting reticle having optical proximity corrections (OPC) features.

Thus, a step-over lithography to produce parabolic photoresist profiles for microlens formation has been disclosed. It will be appreciated that further variations and modifications thereof may be made within the scope of the invention as defined in the appended claims.

We claim:

1. A method of microlens fabrication for use in a photosensor, comprising:
    preparing a photodetector element array which is sensitive to light in a specific color domain;
    depositing microlens material on the photodetector element array;
    coating the microlens material with photoresist;
    masking and exposing the photoresist in a separate exposure for each color in the color domain;
    developing the photoresist;
    etching the microlens material to form a microlens array; and
    completing the photosensor.

2. The method of claim 1 wherein said exposing includes exposing the photoresist above a photodetector element while preventing exposure above a photodetector element from a neighboring pattern.

3. The method of claim 2 wherein the exposed and developed photoresist has a pattern which does not leave a thickness of photoresist over an associated photodetector element.

4. The method of claim 1 wherein said masking and exposing includes providing a separate mask and exposure for each color of the color domain.

5. The method of claim 1 wherein said masking and exposing includes providing a separate mask and exposure for each color of the color domain, wherein each mask is constructed and arranged as a function of a refractive index of the microlens material for each wavelength of the color in the color domain.

6. A method of microlens fabrication for use in a photosensor, comprising:
    preparing a photodetector element array which is sensitive to light in a specific color domain;
    depositing microlens material on the photodetector element array;
    coating the microlens material with photoresist;
    masking and exposing the photoresist in a separate exposure for each color in the color domain, including providing a separate mask and exposure for each color of the color domain;
    developing the photoresist;
    etching the microlens material to form a microlens array; and
    completing the photosensor.

7. The method of claim 6 wherein said exposing includes exposing the photoresist above a photodetector element while preventing exposure above a photodetector element from a neighboring pattern.

8. The method of claim 7 wherein the exposed and developed photoresist has a pattern which does not leave a thickness of photoresist over an associated photodetector element.

9. The method of claim 6 wherein said masking and exposing includes providing a separate mask and exposure for each color of the color domain, wherein each mask is constructed and arranged as a function of a refractive index of the microlens material for each wavelength of the color in the color domain.

10. A method of microlens fabrication for use in a photosensor, comprising:
    preparing a photodetector element array which is sensitive to light in a specific color domain;
    depositing microlens material on the photodetector element array;
    coating the microlens material with photoresist;
    masking and exposing the photoresist in a separate exposure for each color in the color domain, wherein said masking and exposing includes providing a separate mask and exposure for each color of the color domain, wherein each mask is constructed and arranged as a function of a refractive index of the microlens material for each wavelength of the color in the color domain;
    developing the photoresist;
    etching the microlens material to form a microlens array; and
    completing the photosensor.

11. The method of claim 10 wherein said exposing includes exposing the photoresist above a photodetector element while preventing exposure above a photodetector element from a neighboring pattern.

12. The method of claim 11 wherein the exposed and developed photoresist has a pattern which does not leave a thickness of photoresist over an associated photodetector element.

* * * * *